United States Patent [19]

Muto

[11] Patent Number: 4,853,530
[45] Date of Patent: Aug. 1, 1989

[54] REVERSE BIASED PHOTOSENSING SEMICONDUCTOR AND OP AMP ARRANGEMENT WHEREIN THE TWO LOAD RESISTORS OF THE OPERATIONAL AMPLIFIER UNBALANCE THE TWO TRANSISTORS

[75] Inventor: Kazuhiko Muto, Kawasaki, Japan

[73] Assignee: Canon Kabushiki Kaisha, Tokyo, Japan

[21] Appl. No.: 243,250

[22] Filed: Sep. 9, 1988

Related U.S. Application Data

[63] Continuation of Ser. No. 102,264, Sep. 25, 1987, abandoned, which is a continuation of Ser. No. 848,972, Apr. 7, 1986, abandoned.

[30] Foreign Application Priority Data

Apr. 11, 1985 [JP] Japan .................... 60-075272

[51] Int. Cl.$^4$ ............................. H01J 40/14
[52] U.S. Cl. .................... 250/214 A; 330/257
[58] Field of Search ............... 330/257, 59, 110, 308; 250/206, 214, 214 A; 331/10

[56] References Cited

U.S. PATENT DOCUMENTS

| | | | |
|---|---|---|---|
| 3,840,819 | 10/1974 | Steckler | 330/257 |
| 3,852,679 | 12/1974 | Schade, Jr. | 330/257 |
| 4,074,205 | 2/1978 | Robe | 330/257 |
| 4,075,575 | 2/1978 | Robe | 330/257 |
| 4,078,206 | 3/1978 | Crowle | 330/257 |
| 4,158,178 | 6/1979 | Schade, Jr. | 330/257 |
| 4,188,551 | 2/1980 | Iwasaki et al. | 307/311 |
| 4,218,613 | 8/1980 | Bletz | 330/59 |
| 4,591,725 | 5/1986 | Bryant | 250/214 A |
| 4,614,866 | 9/1986 | Liss et al. | 250/214 A |
| 4,626,678 | 12/1986 | Morita et al. | 250/214 A |
| 4,639,134 | 1/1987 | Bletz | 330/59 |
| 4,731,589 | 3/1988 | Preslar | 330/257 |

Primary Examiner—David C. Nelms
Assistant Examiner—William L. Oen
Attorney, Agent, or Firm—Fitzpatrick, Cella, Harper & Scinto

[57] ABSTRACT

A photosensitive semiconductor apparatus in which a photodiode is connected between the inverting input (−) and non-inverting input (+) terminals of an operational amplifier. A non-linear element is connected between the inverting input and output terminals of the amplifier. The amplifier includes a device for applying a reverse voltage across the photodiode. The reverse biasing voltage applying device may include a resistor connected in the circuit including one of the differential active loads of the amplifier, or different areas of the emitters of the differential active loads of the amplifer.

3 Claims, 2 Drawing Sheets

REVERSE BIASED PHOTOSENSING SEMICONDUCTOR AND OP AMP ARRANGEMENT WHEREIN THE TWO LOAD RESISTORS OF THE OPERATIONAL AMPLIFIER UNBALANCE THE TWO TRANSISTORS

This application is a continuation of application Ser. No. 102,264, filed Sept. 25, 1987, now abandoned, which is a continuation of application Ser. No. 848,972, filed Apr. 4, 1986, now abandoned.

BACKGROUND OF THE INVENTION

1. Field of the Invention

The present invention relates to photosensing semiconductor apparatus and particularly to photosensing semiconductor apparatus which measure light using photodiodes and operational amplifiers.

2. Related Background Art

One conventional photosensing semiconductor apparatus will be described with respect to the drawings. FIG. 1 is a schematic of a conventional photo-sensing semiconductor apparatus. FIG. 2 is a circuit diagram of the first stage of an operational amplifier used in the apparatus.

In FIG. 1, reference numeral 14 denotes a photodiode; reference numeral 12, a nonlinear element which includes, herein, a logarithmic compression diode; and reference numeral 13, an operational amplifier. Diode 12 is connected between the inverting input (−) and output terminals of amplifier 13. Photodiode 14 is connected between the inverting input and non-inverting input terminals of the amplifier.

In FIG. 2, references 1, 2 denote active elements which includes, herein, MOSFETs, which constitute a differential input. Reference numerals 3, 4 denote active elements, herein NPN transistors, which constitute active loads for transistors 1, 2. Reference numerals 5, 6 denote offset reducing resistors, the resistances of which are equal. Reference numeral 7 denotes a constant-current source which supplies a biasing current. Reference numeral 8 denotes an offset adjusting resistor connected between external terminals 9 and 10.

The trouble with the operational amplifier of the conventional photosensing semiconductor apparatus is that the offset adjusting resistor must be provided and adjusted so as to nullify the offset voltage of the amplifier due to unavoidable nonuniform manufacture of operational amplifiers.

SUMMARY OF THE INVENTION

In view of the above prior art problem, an object of the present invention is to provide a high-density, high-sensitivity, low-cost photosensing semiconductor apparatus which eliminates external adjustment using an offset adjusting resistor, and can be manufactured in simple steps.

Another object of the present invention is to provide a photosensing semiconductor apparatus with a photodiode and an operational amplifier, the amplifier having means for applying a reverse biasing voltage to the photodiode.

BRIEF DESCRIPTION OF DRAWINGS

FIG. 6 shows the illuminance-output characteristic of the photosensing semiconductor apparatus according to the present invention, thus showing the effect of the present invention.

DETAILED DESCRIPTION OF THE PREFERRED EMBODIMENTS

The embodiments of the present invention will be described in more detail with respect to the drawings.

Figure 1:
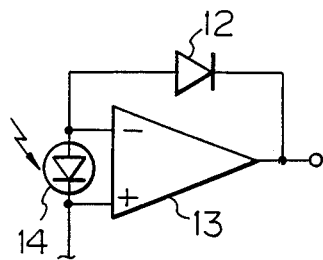
FIG. 1 is a schematic of a conventional photo-sensing semiconductor apparatus.
Figure 2:
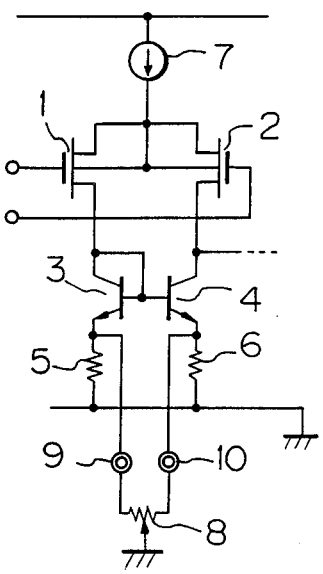
FIG. 2 is a circuit diagram of the first stage of an operational amplifier of the apparatus of FIG. 1.
Figure 2:
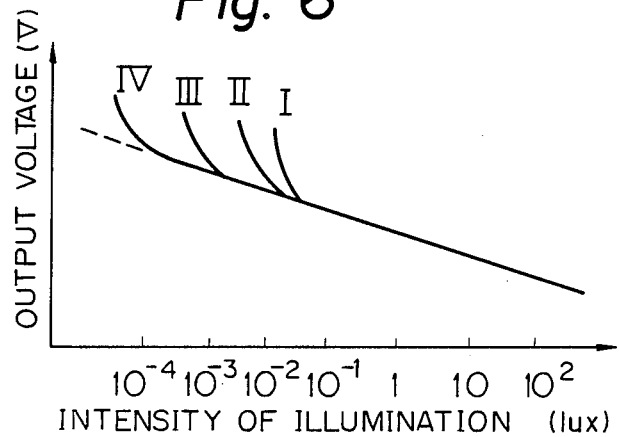
Figure 3:
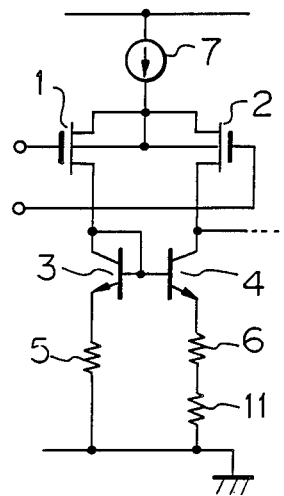
FIG. 3 is a circuit diagram of a first embodiment of the first stage of an operational amplifier of a photosensing semiconductor apparatus according to the present invention.

FIG. 3 is a circuit diagram of a first embodiment of the first stage of an operational amplifier included in a photosensing semiconductor apparatus according to the present invention. The photosensing section of the apparatus is the same as that of the conventional photosensing apparatus shown in FIG. 1.

In FIG. 3, reference numerals 1, 2 denote active elements which include, herein, MOSFETs which constitute a differential input. Reference numeral 3, 4 denote active elements which include, herein, NPN transistors, which constitute active loads for the MOSFETs. Reference numerals 5, 6 denote offset reducing resistors, the resistances of which are equal. Reference numeral 7 denotes a constant-current source which supplies a biasing current. Reference numeral 11 denotes a resistor provided separately from offset reducing resistors 5, 6. Provision of resistor 11 renders unequal the values of the two currents flowing through resistors 5 and 6 which are equal in the conventional apparatus; i.e., the current flowing through FET 1 and the current flowing through FETs 1 and 2 in the conventional apparatus are larger in value than the current flowing through FET 2. As a result, in order to satisfy this unequality of the currents, the input terminal voltage of FET 1 forming one of the differential inputs is lowered below the input terminal voltage of FET 2 and reverse biasing voltage is applied across a photodiode (not shown), such as photodiode 14 of FIG. 1 connected between the input terminal of FETs 1 and 2. The operation of the MOSFETs will not be described. The drain current $I_D$ of a MOSFETs is generally expressed by:

$$I_D = \tfrac{1}{2}\mu\epsilon_0\epsilon_{OX}\frac{W}{t_{OX}L} V_T^2 \left(\frac{V_{GS}}{V_T} - 1\right)^2 \quad 1$$

where $V_{GS}$ is the gate voltage and $V_T$ the gate threshold voltage. Assuming that $$\tfrac{1}{2}\mu\epsilon_0\epsilon_{OX}\frac{W}{t_{OX}L} = K,$$

equation 1 will be:

$$I_D = KV_T^2 \left(\frac{V_{GS}}{V_T} - 1\right)^2 \quad 2$$

Equation 2 can be modified as follows:

$$V_{GS} = V_T + \sqrt{\frac{I_D}{K}} \qquad 3$$

Assuming that the gate voltage and drain current of input MOSFET 1 of operational amplifier are $V_{GS1}$ and $I_{D1}$, respectively, and that the gate voltage and drain current of MOSFET 2 are $V_{GS2}$ and $I_{D2}$, respectively, the following equations will be obtained:

$$V_{GS1} = V_T + \sqrt{\frac{V_{D1}}{K_1}} \qquad 4$$

$$V_{GS2} = V_T + \sqrt{\frac{V_{D2}}{K_2}} \qquad 5$$

The input terminal differential voltage $V_0$ is represented by the difference between equations 4 and 5:

$$V_0 = V_{T1} - V_{T2} + \sqrt{\frac{I_{D1}}{K_1}} - \sqrt{\frac{I_{D2}}{K_2}} \qquad 6$$

If only current is considered and $V_T = V_{T2}$, $K_1 = K_2 = K$, equation 6 will be:

$$V_0 = \frac{1}{\sqrt{K}} (\sqrt{I_{D1}} - \sqrt{I_{D2}}) \qquad 7$$

Assuming that the difference between $I_{D1}$ and $I_{D2}$ is $\Delta I_D$, $$I_{D1} = I_D + \tfrac{1}{2}\Delta I_D \qquad 8$$

$$I_{D2} = I_D - \tfrac{1}{2}\Delta I_D \qquad 9$$

Substituting equations 8 and 9 into equation 7, and neglecting the higher-order teams, then the following equation is obtained:

$$V_0 = \frac{\sqrt{I_D}}{2\sqrt{K}} \cdot \frac{\Delta I_D}{I_D} \qquad 10$$

This shows that the differential voltage $V_0$ is produced across the input terminals by currents flowing through FETs 1 and 2.

As described above, in order to render the current flowing through NPN transistor 3 larger than that flowing through NPN transistor 4, resistor 11 is utilized as shown. In addition, for the same purpose, the circuit of FIG. 4 may be used which is obtained by removing resistors 5 and 11 and leaving resistor 6 from the circuit of FIG 3, or the circuit of FIG. 5 may be used which is obtained by removing resistors 5, 6 and 11 from the circuit of FIG. 3 and in which the areas of the emitters of transistor 3 and 4 differ.

Figure 4:
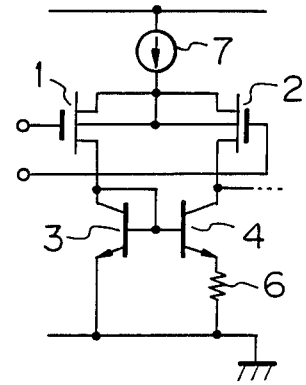
FIG. 4 is a circuit diagram of a second embodiment of the first stage of the operational amplifier.
Figure 5:
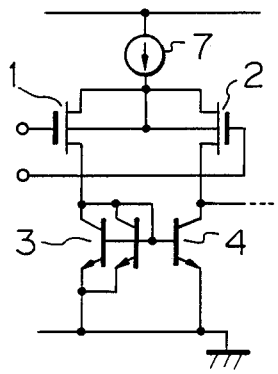
FIG. 5 is a circuit diagram of a third embodiment of the first stage of the operational amplifier.

In the above photosensing semiconductor apparatus according to the present invention, the operational amplifier is capable of applying a reverse biasing voltage across the photodiode connected between the differential input terminals. FIG. 6 shows the output characteristic depending on the biasing voltage applied by the operational amplifier of the photosensing semiconductor apparatus according to the present invention. The curve I shows the characteristic when the biasing voltage is a forward biasing voltage; the curve II the characteristic when the biasing voltage is zero; the curve III the characteristic when the biasing voltage is a reverse biasing voltage; and the curve IV the characteristic when the biasing voltage is reverse biasing voltage even higher than that at III. It will be understood from FIG. 6 that the output linearity is improved as the biasing voltage increases in the reverse biasing direction and a higher-sensitivity, photosensing semiconductor apparatus is obtained. If the resistances of the resistors which generate reverse biasing voltage, or the area of the emitter of the transistor as an active element, as shown in FIGS. 3-5, are set to their respective appropriate values so that the resulting reverse biasing voltages are higher than the maximum positive one of possible different offset voltage of operational amplifiers occurring due to unequal manufacture and lower than the voltage above which the amplifiers may malfunction, the resistors which adjust the offset voltages of operational amplifiers may be eliminated.

As described above, according to the particular embodiments of the photosensing semiconductor apparatus, any reverse biasing voltage can be generated, no offset adjusting resistors are needed, and thus a photosensing semiconductor apparatus with high-linearity output and high sensitivity is provided.

What I claim is:

1. A photosensing semiconductor apparatus comprising an operational amplifier having a pair of differential input terminals, and a photodiode connected across said pair of differential input terminals of said operational amplifier and reverse biased by a voltage difference across said pair of differential input terminals;

said operational amplifier comprising:

a pair of transistor devices constituting a differential amplifier, and a pair of loads respectively connected to said pair of transistor devices, wherein the resistance of said pair of loads are selected so as to unbalance said pair of transistor devices, so that the voltage difference across said pair of differential input terminals is produced by a bias current in said pair of transistor devices.

2. A photosensing semiconductor apparatus according to claim 1, wherein the voltage difference generated across said pair of differential input terminals is larger than a maximum offset voltage in said operational amplifier.

3. A photosensing semiconductor apparatus according to claim 1, further comprising a non-linear element connected between one of said pair of differential input terminals and an output terminal of said operational amplifier.

* * * * *